United States Patent
Dronhofer et al.

(10) Patent No.: US 10,854,436 B2
(45) Date of Patent: Dec. 1, 2020

(54) CONNECTOR PIECE FOR A TUBULAR TARGET

(71) Applicant: PLANSEE SE, Reutte (AT)

(72) Inventors: Andre Dronhofer, Reutte (AT); Christian Linke, Ehenbichl (AT)

(73) Assignee: PLANSEE SE, Reutte (AT)

(*) Notice: Subject to any disclaimer, the term of this patent is extended or adjusted under 35 U.S.C. 154(b) by 190 days.

(21) Appl. No.: 15/571,580

(22) PCT Filed: Apr. 28, 2016

(86) PCT No.: PCT/AT2016/000045
§ 371 (c)(1),
(2) Date: Nov. 3, 2017

(87) PCT Pub. No.: WO2016/176697
PCT Pub. Date: Nov. 10, 2016

(65) Prior Publication Data
US 2018/0138024 A1    May 17, 2018

(30) Foreign Application Priority Data
May 6, 2015 (AT) .............................. GM 107/2015

(51) Int. Cl.
*H01J 37/34* (2006.01)
*C23C 14/34* (2006.01)

(52) U.S. Cl.
CPC ...... *H01J 37/3435* (2013.01); *C23C 14/3407* (2013.01); *H01J 37/347* (2013.01); *H01J 37/3455* (2013.01)

(58) Field of Classification Search
CPC .. H01J 37/3435; H01J 37/3455; H01J 37/347; C23C 14/3407

USPC ......................... 204/298.21, 298.22
See application file for complete search history.

(56) References Cited

U.S. PATENT DOCUMENTS

| | | | | |
|---|---|---|---|---|
| 2,254,698 A * | 9/1941 | Hansen, Jr. | ............ | G01R 11/14 310/90.5 |
| 4,277,304 A * | 7/1981 | Horiike | ............ | H01J 37/08 156/345.39 |
| 4,478,703 A * | 10/1984 | Edamura | ............ | H01J 37/3405 204/192.12 |
| 4,892,451 A * | 1/1990 | Mahler | ............ | H01L 21/68707 414/217 |
| 6,251,242 B1 * | 6/2001 | Fu | ............ | C23C 14/35 204/192.2 |

(Continued)

FOREIGN PATENT DOCUMENTS

| CN | 1491295 A | 4/2004 |
|---|---|---|
| CN | 101506404 A | 8/2009 |

(Continued)

OTHER PUBLICATIONS

Translation to Edamura (JP 59-197570) published Nov. 1984 (Year: 1984).*

*Primary Examiner* — John J Brayton
(74) *Attorney, Agent, or Firm* — Laurence A. Greenberg; Werner H. Stemer; Ralph E. Locher

(57) ABSTRACT

A connection piece for a tubular target which has a cylindrical inner surface and a cylindrical outer surface and at least one magnetic insert. The position of the magnetic insert is adjustable along the axial direction of the connection piece on at least an inner surface or outer surface of the connection piece.

23 Claims, 2 Drawing Sheets

(56) References Cited

U.S. PATENT DOCUMENTS

| | | | |
|---|---|---|---|
| 6,375,815 B1 | 4/2002 | Lynn et al. | |
| 6,756,081 B2 | 6/2004 | Lupton et al. | |
| 8,137,518 B2 | 3/2012 | Pavel et al. | |
| 8,652,310 B2 * | 2/2014 | McLeod | C23C 14/3407 204/192.12 |
| 2002/0096430 A1 | 7/2002 | Lupton et al. | |
| 2004/0178056 A1 | 9/2004 | De Bosscher et al. | |
| 2007/0051617 A1 | 3/2007 | White et al. | |
| 2008/0047831 A1 | 2/2008 | Richert et al. | |
| 2010/0018854 A1 | 1/2010 | McLeod | |
| 2010/0028720 A1 | 2/2010 | Nishida et al. | |
| 2010/0044222 A1 | 2/2010 | Miller et al. | |
| 2011/0155568 A1 | 6/2011 | Crowley et al. | |
| 2012/0048724 A1 | 3/2012 | McLeod | |
| 2012/0261253 A1 | 10/2012 | Madocks et al. | |
| 2012/0305393 A1 | 12/2012 | Ivanov et al. | |
| 2014/0178056 A1 | 6/2014 | Zhu et al. | |
| 2014/0238850 A1 | 8/2014 | Abenthung et al. | |
| 2014/0246310 A1 | 9/2014 | Crowley et al. | |
| 2014/0246312 A1 | 9/2014 | Crowley et al. | |

FOREIGN PATENT DOCUMENTS

| | | | | |
|---|---|---|---|---|
| CN | 201545907 U | 8/2010 | | |
| CN | 1537318 B | 1/2011 | | |
| CN | 103572231 A | 2/2014 | | |
| DE | 102007060306 A1 | 6/2009 | | |
| DE | 102013103472 A1 | 10/2014 | | |
| EP | 1225249 B1 | 12/2009 | | |
| EP | 2769002 A1 | 8/2014 | | |
| JP | 59197570 A | * | 11/1984 | .......... H01J 37/3405 |
| JP | H0554551 U | 7/1993 | | |
| JP | 2010037583 A | 2/2010 | | |
| KR | 101352379 B1 | 1/2014 | | |
| WO | 03015124 A1 | 2/2003 | | |
| WO | 2011102896 A1 | 8/2011 | | |
| WO | 2013056286 A1 | 4/2013 | | |

* cited by examiner

CONNECTOR PIECE FOR A TUBULAR TARGET

BACKGROUND OF THE INVENTION

Field of the Invention

The invention relates to a connection piece for a tubular target, which connection piece has a cylindrical inner face and a cylindrical outer face and at least one magnetic insert, wherein the position of the magnetic insert is alterable along the axial direction of the connection piece on at least an inner or outer face of the connection piece.

By target should here be understood a sputtering source for a cathode sputtering plant. In cathode sputtering, target material is "sputtered" by means of plasma and deposited as a thin layer on a substrate. Cathode sputtering is commonly also designated as sputtering, the sputtering sources as sputtering targets. A target having a tubular target body is therefore a sputtering target in tubular form and is also referred to as a tube target. A particularly frequently used sputtering process is magnetron sputtering. Whilst in simple cathode sputtering only an electric field is applied, in magnetron sputtering a magnetic field is additionally generated. Through the superimposition of electric and magnetic field, the path of the charge carriers is lengthened and the number of collisions per electron increased. The magnetic field is usually generated by a magnet or an arrangement of a plurality of magnets, which magnet or magnets is/are incorporated inside the tube target.

An advantage of tubular targets (tube targets) is the more uniform material removal and thus a higher utilization factor compared to planar targets. By utilization factor is understood the sputtered-off material mass after the total service time of the target, related to the mass of the target prior to first usage. Thus the utilization factor for planar is round about 15 to 30%, and for tube targets typically around 70 to 90%.

It is known that tube targets can be produced as monolithic targets. Monolithic targets usually have no continuous support tube. Monolithic targets are substantially less temperature sensitive, whereby particularly high power densities of up to 30 kW/m are possible in the course of the sputtering. Thus maximal deposition rates and a higher throughput are possible, whereby the properties of the deposited layers can be improved.

The monolithic design of tube targets is advantageous in particular in the case of metallic targets, insofar as the sputtering material which is used has a sufficiently high mechanical strength, ductility and fracture toughness. Particularly critical for the use of monolithic targets are the mechanical characteristic values and the geometrical layout of the end region, since here partially very thin wall thicknesses (preferably less than 4 mm) must be realized. This is usually effected by mechanical machining of the target body. In the event of damage to one or the end region(s) of a monolithic tube target, in the worst case the entire target cannot be used and has to be newly produced.

An alternative to the mechanical machining of the end region(s) of the target body are connection pieces, as disclosed, for instance, in EP 1 225 249 B1.

Alternatively to monolithic targets, bonded targets are additionally known. The target body is here applied by soldering or bonding to a support tube, wherein a low-melting solder is commonly used. As a result, such targets are more temperature sensitive and, given the delivery of high power densities and thus the development of higher temperatures, a (partial) melting of the (normally low-melting indium) solder and a detachment of the target body from the support tube can ensue.

As a result of the more favourable heat transfer in a tubular target, the cooling of the target, which is realized in the interior of a tube target, is substantially more effective than in planar targets, which enables higher superficial energy densities and thus higher coating rates. Moreover, the tendency to local arc formation (also referred to as arcing) is also reduced, in particular in the case of reactive sputtering. The use of tube targets is particularly advantageous when large-area substrates are coated. During use, the tube target slowly rotates, whilst the magnetic field is usually stationary.

EP 1 225 249 B1 discloses a tubular target for sputtering plants. At the ends of a tubular target body is respectively disposed a support tube or a connecting tube. By means of the support tubes, which protrude from the target body, the target is installed in a plant. In one embodiment, a support tube is inserted into an open end of the target body and subsequently secured by means of a screw, which is screwed through a flange of the support tube into a front edge of the target body. Alternatively, on the target body is provided an external thread for a union nut by means of which a flange of the support tube can be pressed against the front end of the target body. Measures or embodiments for increasing the material utilization of the tube target are not described.

DE 10 2007 060306 A1 discloses a tubular sputtering target having a support tube and a target material disposed on the support tube. Between the target material and the support tube is disposed a ferromagnetic material in order to obtain a uniform removal of the target material during the sputtering. The ferromagnetic material can be sprayed onto the support tube by means of plasma spraying, wherein the thickness of the material along a longitudinal axis of the support tube continually varies. An alteration of the magnetic properties of the intermediate layer or a purposeful influencing of the erosion profile during the period of use of the target is not possible with the described embodiment. An application in monolithic targets or monolithic targets having separate connection pieces is not described.

WO 2011 102896 A1 discloses a sputtering target which contains a backplate, having a front and a rear side, and a target plate, having a front and a rear side, which is applied to the backplate. At least a rear side of the target plate, front side of the backplate or rear side of the backplate has at least one recess, which in shape and size is configured such that it corresponds to a region with perceptibly higher sputtering of the target plate in comparison to an adjacent region of the target plate. In the at least one recess is placed an insert. The backplate contains a first material, the target plate contains a second material, and an insert contains a third material. In addition, a method of controlling the electromagnetic properties of a sputtering target is disclosed.

US 2010 0044222 A1 discloses a support tube for a sputtering target which is slightly ferromagnetic and thereby reduces the incidence or strength of short-range deviations of the magnetic field during the magnetron sputtering of cylindrical sputtering targets. Thus optimized alloys for ferromagnetic support tubes improve the uniformity of the magnetic field which is generated by a magnetic rod. It is thus possible to reduce short-range deviations of the magnetic field to less than 5% of the average value. The disclosed slightly ferromagnetic support tubes can be used in conjunction with or instead of inserts which are used to influence long-range deviations of the magnetic field. An application is described only for tube targets bonded over the entire length. An adaptation of the magnetic properties during the period of use of the targets is not described.

It is known that, as a result of deviations in the magnetic field, a non-uniform sputter removal at the ends of a tube target can occur, which in turn leads to a reduced material utilization due to a shorter working life. This non-uniform material removal is influenced by different factors and is dependent on the target geometry, the magnetrons and the usage conditions of the tube target (for instance rotation speed, power density, argon pressure). Measures for increasing the material utilization can be, for instance, thickened ends of the tube targets, so that more material is provided at the places which show an increased material removal. This design is referred to as "dog bone" due to the characteristic shape, and is described, for instance, in EP 2 769 002 A1.

For each tube target whereof the material utilization is intended to be increased, an own and adapted design of the target geometry must be produced or machined. In particular in monolithic targets with or without connection piece(s), an increased production engineering complexity is associated therewith.

SUMMARY OF THE INVENTION

The object of the invention is to provide an improved connection piece for a tubular target. Such a connection piece is intended to lead to an extended service life of the tube target, to be cost-effective and easily installable.

This object is achieved with the features as claimed. Advantageous embodiments are the subject of the subclaims.

DESCRIPTION OF THE INVENTION

A connection piece according to the invention for a tubular target has a cylindrical inner face and a cylindrical outer face and at least one magnetic insert, and is characterized in that the position of the magnetic insert is alterable along the axial direction of the connection piece on at least an inner or outer face of the connection piece.

Through the alterable position of the at least one magnetic insert, the removal profile of the tube target during use in a coating plant can be purposefully altered and adapted.

Preferably, the position of the magnetic insert is alterable along the axial direction of the connection piece on at least an inner or outer face of the connection piece by rotation about the longitudinal axis of the connection piece or by displacement in the axial direction of the connection piece.

An alteration of the position of the at least one magnetic insert is achieved particularly easily and in few steps by rotation about the longitudinal axis (corresponds to the longitudinal axis of the tube target) of the connection piece or by displacement in the axial direction of the connection piece.

Preferably, the at least one magnetic insert consists of a metal or an alloy, particularly preferably of a ferromagnetic metal or a ferromagnetic alloy. Through the use of a ferromagnetic metal or a ferromagnetic alloy, the effect of the magnetic insert is given to a particular extent, since a weakening of the magnetic field can thus occur in those regions of the tube target which would otherwise show an increased material removal. Through the achievable weakening of the magnetic field, the removal rate of the material is reduced and an increased material utilization of the tube target is achieved overall.

Through the respective choice of an appropriate metal or an appropriate alloy, the effect of the at least one magnetic insert can be purposefully controlled by the respectively resulting permeability. The metal or alloy chosen for the insert should additionally exhibit good mechanical machinability (for example by milling, turning, grinding), sufficiently high ductility and good corrosion resistance to the cooling water. The selection of a suitable metal or alloy can be made in dependence on the respective magnetic properties of the magnetron, so that an adaptation to the operating conditions is given.

In a preferred embodiment, the at least one magnetic insert consists of a metal/an alloy from the group (iron, iron alloy, nickel, nickel alloy, cobalt, cobalt alloy).

The at least one magnetic insert can be connected in various ways to the connection piece. It can thus be applied, for instance, only by a suitable fit, to a cylindrical outer side or a cylindrical inner side of the connection piece, so that an alteration of the position along the axial direction is possible by displacement of the insert in the axial direction, and the insert can be shifted, adjusted or positioned during the operating period of the target, without the connection piece containing the insert having to be removed or detached from the target body.

Preferredly, the at least one magnetic insert is connected to the connection piece, however, by means of a screw joint. Through the use of a screw joint, it is ensured that the magnetic insert, during the use of the tube target in a coating plant, cannot slip, for instance through the influence of the magnetic field, or where the tube target is vertically arranged in a coating plant. Through the use of a screw joint, the position of the at least one magnetic insert can also be adjusted steplessly and very precisely along the axial direction of the connection piece. Similarly, by virtue of a screw joint, a centring of the insert is easily given, so that a uniform weakening of the magnetic field during the rotation of the tube target is ensured.

In a preferred embodiment, the at least one magnetic insert is connected to a part of the cylindrical inner face of the connection piece. This arrangement has the advantage that the magnetic insert is easily accessible and can be positioned without great effort. The position of the insert can be altered independently of the fitted connection piece or adapted to the actual removal profile of the tube target without the connection piece itself having to be removed from the tube target body.

In an alternative preferred embodiment, the at least one magnetic insert is connected to a part of the cylindrical outer face of the connection piece. This arrangement has the advantage that the insert is not in direct contact with the cooling water and the insert is fitted closer to the outer surface of the tube target body, so that a purposeful influencing of the material removal is possible.

Further preferably, the at least one magnetic insert has at least one means, which is contactable with at least a hand, a tool or a magnet and by means of which the axial position of the at least one magnetic insert is alterable.

In particularly preferred embodiments, this at least one means has at least one element from the group (notch, depression, trough, recess, groove, channel, bore, journal, thread, cone, taper, edge) in the radial direction of the magnetic insert. The at least one element from the group (notch, depression, trough, recess, groove, channel, bore, journal, thread, cone, taper, edge) is designed such that an appropriate tool, for instance a pair of pliers, a pin, a tongue, a spanner, or a human hand can engage in these or grip these. It is thereby possible in a particularly precise manner to alter the position of the at least one magnetic insert along the axial direction of the connection piece.

In a further embodiment, the position of the magnetic insert is alterable through the use of a magnet. For instance, the position of a ferromagnetic insert can be altered by means of a permanent magnet (for example steel-based or rare-earth magnet).

In a further embodiment, a connection piece according to the invention has two or more magnetic inserts. Through the use of a plurality of magnetic inserts, the magnetic field in the end region of the tube target can be influenced in a particularly flexible and customized manner.

BRIEF DESCRIPTION OF THE SEVERAL VIEWS OF THE DRAWING

Embodiments of the invention are explained in greater detail on the basis of the figures, wherein.

Figure 1:
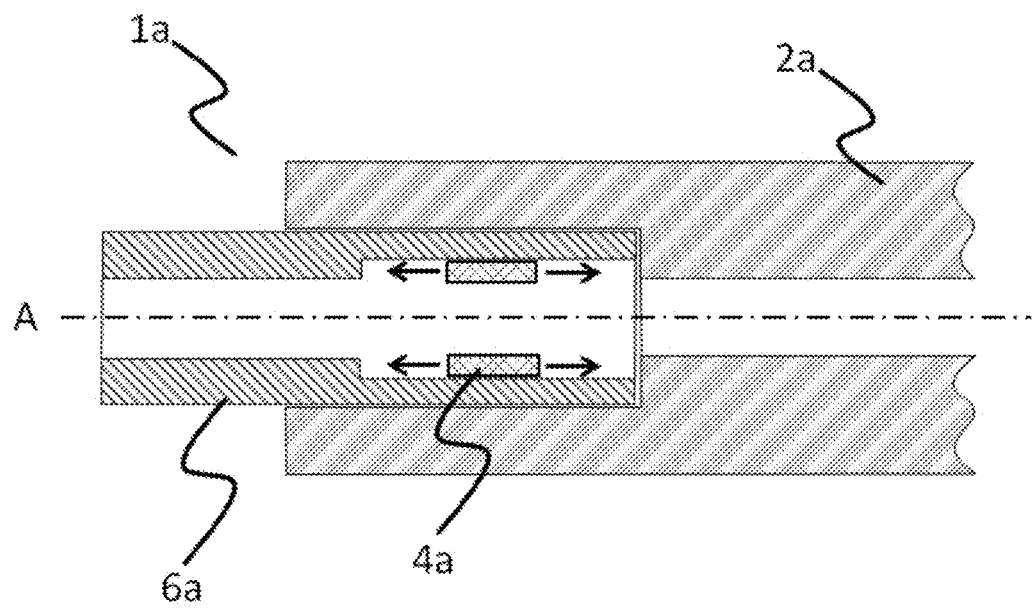
FIG. 1 shows a schematic representation of one end of a tube target (1a) in sectioned side view according to a first embodiment, wherein a connection piece (6a) according to the invention is disposed at one end of the tubular target body (2a). The connection piece has a magnetic insert (4a), the position of which is alterable along the axial direction of the connection piece (arrow direction). In this embodiment, the magnetic insert is disposed on a cylindrical inner face of the connection piece
Figure 2:
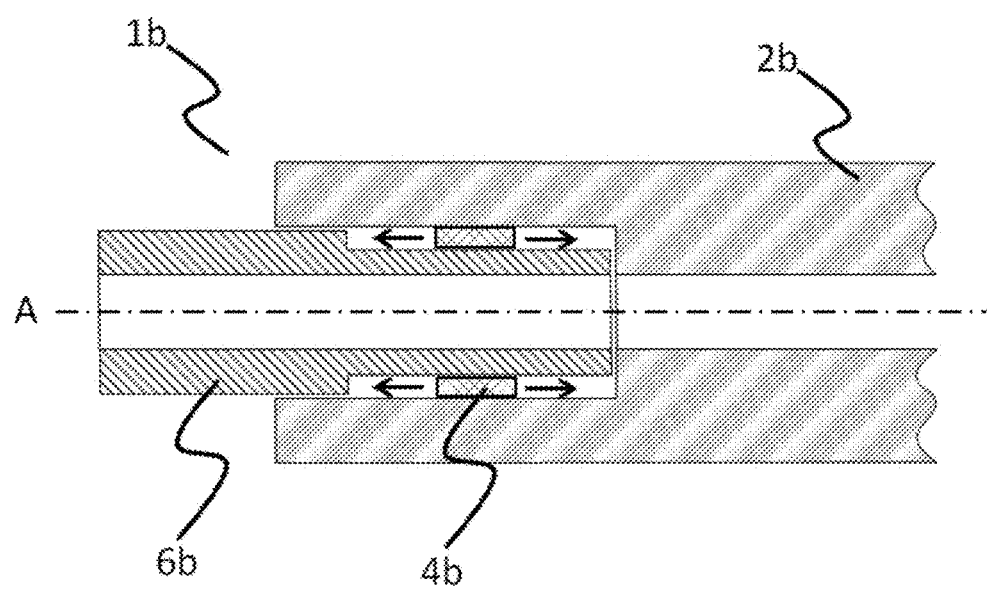
FIG. 2 shows a schematic representation of one end of a tube target (1b) in sectioned side view according to a second embodiment, wherein a connection piece (6b) according to the invention is disposed at one end of the tubular target body (2b). The connection piece has a magnetic insert (4b), the position of which is alterable along the axial direction of the connection piece (arrow direction). In this embodiment, the magnetic insert is disposed on a cylindrical outer face of the connection piece
Figure 3:
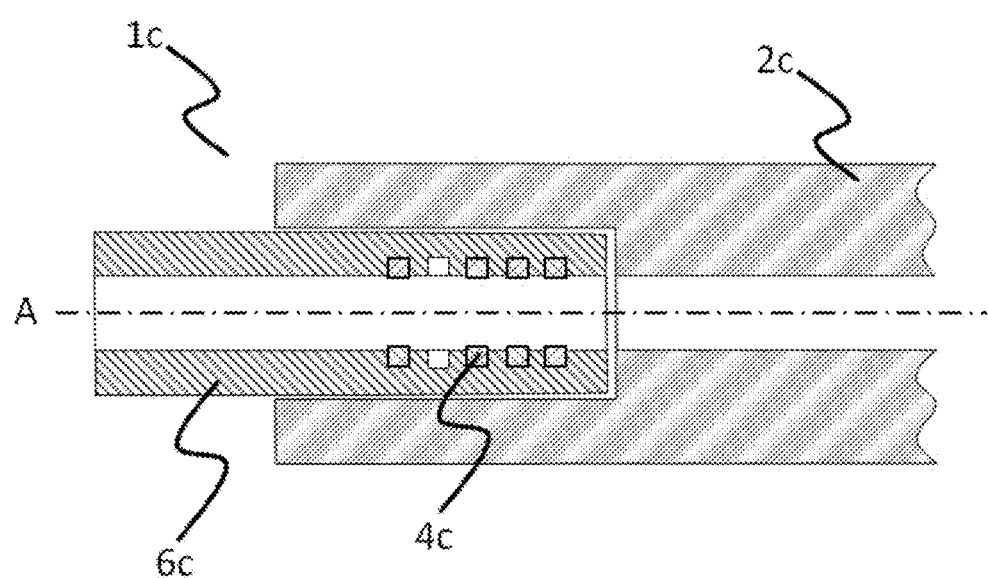
FIG. 3 shows a schematic representation of one end of a tube target (1c) in sectioned side view according to a third embodiment, wherein a connection piece (6c) is disposed at one end of the tubular target body (2c). The connection piece has a plurality of magnetic inserts (4c), which are fitted on the cylindrical inner side of the connection piece. These can be, for instance, inserts screwed into the connection piece or inserts placed only into the cylindrical inner face of the connection piece. Also the position of these inserts is alterable along the axial direction of the connection piece. Thus individual inserts can be purposefully fitted, removed again, or repositioned. In this embodiment, the number of magnetic inserts is thus also purposefully alterable.

REFERENCE SYMBOL LIST 1a-c tube target
2a-c target body
4a-c magnetic insert
6a-c connection piece
A tube target axis

The invention claimed is:

1. An apparatus, comprising:
a connection piece for a tubular target, said connection piece including a cylindrical inner face and a cylindrical outer face;
at least one magnetic insert disposed on at least one of said inner face or said outer face;
said at least one magnetic insert being moveably disposed on said connection piece such that a position of said at least one magnetic insert is alterable along an axial direction of said connection piece on at least said inner face or said outer face; and
said at least one magnetic insert connected in a manner selected from the group consisting of:
said at least one magnetic insert connected to said inner face to enable an alteration of the position of said at least one magnetic insert along the axial direction of the connection piece by displacing said at least one magnetic insert in the axial direction,
said at least one magnetic insert connected to said outer face, and
said at least one magnetic insert connected to said connection piece by a screw joint such that the position of said at least one magnetic insert is alterable along the axial direction of the connection piece on at least said inner face or said outer face;
wherein said at least one magnetic insert is connected to said connection piece such that the position of said at least one magnetic insert is alterable along the axial direction of said connection piece on at least said inner face or said outer face without removing said connection piece from a target body of the tubular target.

2. The apparatus according to claim 1, wherein the position of said at least one magnetic insert is alterable along the axial direction of said connection piece by rotation about a longitudinal axis of the connection piece or by displacement in the axial direction of said connection piece.

3. The apparatus according to claim 1, wherein said at least one magnetic insert consists of a metal or an alloy.

4. The apparatus according to claim 1, wherein said at least one magnetic insert consists of a ferromagnetic metal or a ferromagnetic alloy.

5. The apparatus according to claim 1, wherein said at least one magnetic insert consists of a metal or an alloy of metals selected from the group consisting of iron, iron alloy, nickel, nickel alloy, cobalt and cobalt alloy.

6. The apparatus according to claim 1, wherein said at least one magnetic insert is connected to said connection piece by way of a screw joint.

7. The apparatus according to claim 1, wherein said at least one magnetic insert is connected to a part of said cylindrical inner face of said connection piece.

8. The apparatus according to claim 1, wherein said at least one magnetic insert is connected to a part of said cylindrical outer face of said connection piece.

9. The apparatus according to claim 7, wherein said at least one magnetic insert includes a device configured for contacting by at least a hand, a tool or a magnet and for altering an axial position of said at least one magnetic insert.

10. The apparatus according to claim 9, wherein said at least one device includes an element selected from the group consisting of a notch, a depression, a trough, a recess, a groove, a channel, a bore, a journal, a thread, a cone, a taper and an edge formed in a radial direction of said at least one magnetic insert.

11. The apparatus according to claim 1, wherein said at least one magnetic insert is one of two or more magnetic inserts.

12. An apparatus, comprising:
a tubular target having a tubular target body;
a connection piece disposed on said tubular target body, said connection piece including a cylindrical inner face and a cylindrical outer face;
at least one magnetic insert disposed on at least one of said inner face or said outer face;
said at least one magnetic insert being moveably disposed on said connection piece such that a position of said at least one magnetic insert is alterable along an axial direction of said connection piece on at least said inner face or said outer face; and said at least one magnetic insert connected in a manner selected from the group consisting of:

said at least one magnetic insert connected to said inner face to enable an alteration of the position of said at least one magnetic insert along the axial direction of the connection piece by displacing said at least one magnetic insert in the axial direction, said at least one magnetic insert connected to said outer face, and said at least one magnetic insert connected to said connection piece by a screw joint such that the position of said at least one magnetic insert is alterable along the axial direction of the connection piece on at least said inner face or said outer face.

13. The apparatus according to claim 12, wherein said at least one magnetic insert is connected to said connection piece such that the position of said at least one magnetic insert is alterable along the axial direction of said connection piece on at least said inner face or said outer face without removing said connection piece from said tubular target body of said tubular target.

14. The apparatus according to claim 12, wherein the position of said at least one magnetic insert is alterable along the axial direction of said connection piece by rotation about a longitudinal axis of the connection piece or by displacement in the axial direction of said connection piece.

15. The apparatus according to claim 12, wherein said at least one magnetic insert consists of a metal or an alloy.

16. The apparatus according to claim 12, wherein said at least one magnetic insert consists of a ferromagnetic metal or a ferromagnetic alloy.

17. The apparatus according to claim 12, wherein said at least one magnetic insert consists of a metal or an alloy of metals selected from the group consisting of iron, iron alloy, nickel, nickel alloy, cobalt and cobalt alloy.

18. The apparatus according to claim 12, wherein said at least one magnetic insert is connected to said connection piece by way of a screw joint.

19. The apparatus according to claim 12, wherein said at least one magnetic insert is connected to a part of said cylindrical inner face of said connection piece.

20. The apparatus according to claim 12, wherein said at least one magnetic insert is connected to a part of said cylindrical outer face of said connection piece.

21. The apparatus according to claim 19, wherein said at least one magnetic insert includes a device configured for contacting by at least a hand, a tool or a magnet and for altering an axial position of said at least one magnetic insert.

22. The apparatus according to claim 21, wherein said at least one device includes an element selected from the group consisting of a notch, a depression, a trough, a recess, a groove, a channel, a bore, a journal, a thread, a cone, a taper and an edge formed in a radial direction of said at least one magnetic insert.

23. The apparatus according to claim 12, wherein said at least one magnetic insert is one of two or more magnetic inserts.

* * * * *